United States Patent
Hegde

(10) Patent No.: US 9,590,063 B2
(45) Date of Patent: Mar. 7, 2017

(54) METHOD AND STRUCTURE FOR A LARGE-GRAIN HIGH-K DIELECTRIC

(71) Applicant: FREESCALE SEMICONDUCTOR, INC., Austin, TX (US)

(72) Inventor: Rama I. Hegde, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/576,537

(22) Filed: Dec. 19, 2014

(65) Prior Publication Data

US 2016/0181158 A1 Jun. 23, 2016

(51) Int. Cl.
| | |
|---|---|
| H01L 21/3205 | (2006.01) |
| H01L 29/423 | (2006.01) |
| H01L 29/51 | (2006.01) |
| H01L 21/02 | (2006.01) |
| H01L 21/285 | (2006.01) |
| H01L 21/28 | (2006.01) |

(52) U.S. Cl.
CPC .... H01L 29/42364 (2013.01); H01L 21/0228 (2013.01); H01L 21/02181 (2013.01); H01L 21/28194 (2013.01); H01L 21/28556 (2013.01); H01L 29/517 (2013.01)

(58) Field of Classification Search
CPC ............... H01L 21/823437; H01L 27/11233
See application file for complete search history.

(56) References Cited

U.S. PATENT DOCUMENTS

| | | | |
|---|---|---|---|
| 5,654,203 A | 8/1997 | Ohtani et al. | |
| 7,560,793 B2 | 7/2009 | Derderian et al. | |
| 7,749,574 B2 | 7/2010 | Mahajani et al. | |
| 7,824,990 B2 | 11/2010 | Chang et al. | |
| 8,377,743 B2 | 2/2013 | Shieh et al. | |
| 2005/0023584 A1* | 2/2005 | Derderian | C23C 16/452 257/296 |
| 2010/0005974 A1 | 1/2010 | Cadoret et al. | |

OTHER PUBLICATIONS

Lanza, M., et al., "Polycrystallization effects on the nanoscale electrical properties of high-k dielectrics", Nanoscale Research Letters, vol. 6, No. 108, 2011, pp. 1-9.
Subramanian, V. et al., "A Novel Technique for 3-d Integration: Ge-seeded Laterally Crystallized TFTs", 1997 Symposium on VLSI Technology Digest of Technical Papers, Jun. 10-12, 1997, pp. 97-98.
Triyoso, D., et al., "Physical and electrical characteristics of atomic-layer-deposited hafnium dioxide formed using hafnium tetrachloride and tetrakis (ethylmethylaminohafnium)", Journal of Applied Physics, vol. 97, No. 12, pp. 124107-1-124107-9, 2005.

* cited by examiner

*Primary Examiner* — Elias M Ullah

(57) ABSTRACT

A method of forming a semiconductor device (100) includes depositing a metal oxide (104) over the substrate (102). The depositing includes combining a first metal and oxygen to form the metal oxide having grains and further adding a catalyst during the combining. The catalyst causes the grains to be bigger than would occur in the absence of the catalyst. A conductive layer (202) is formed over the metal oxide.

14 Claims, 4 Drawing Sheets

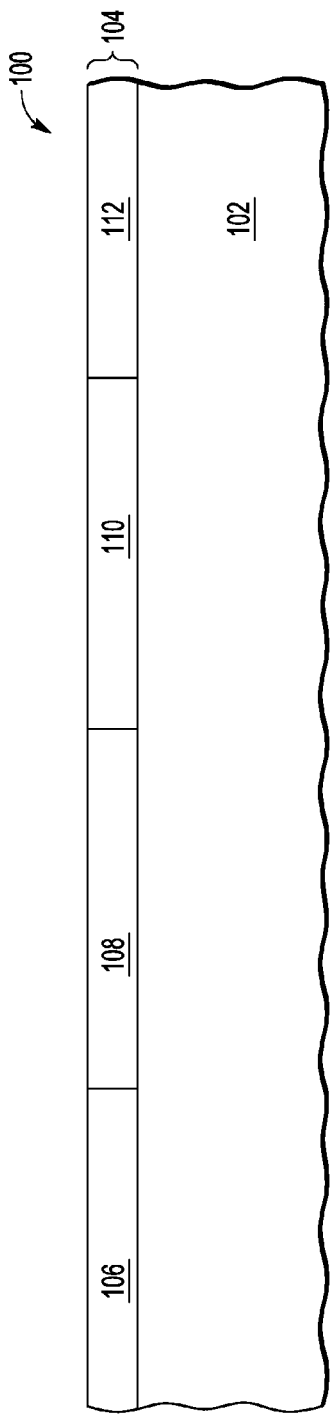
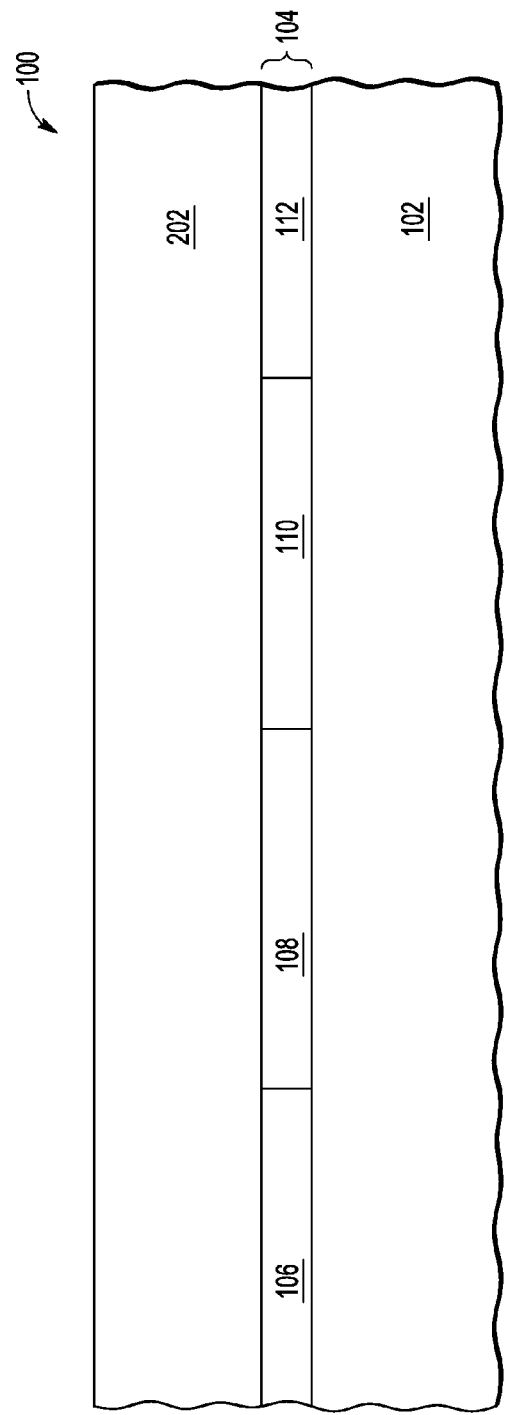
FIG. 1
FIG. 2

METHOD AND STRUCTURE FOR A LARGE-GRAIN HIGH-K DIELECTRIC

BACKGROUND

Field

This disclosure relates generally to high-k dielectric used in semiconductor manufacturing, and more specifically, to methods and structures for a large-grain high-k dielectric.

Related Art

In some manufacturing processes for semiconductor devices, a metal oxide gate dielectric with multiple grain boundaries incident under a metal gate may present challenges for advanced technology nodes, particularly as the scale of semiconductor devices continues to decrease.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates an example cross-section of semiconductor device at a step in a manufacturing process for forming the semiconductor device, in accordance with certain aspects of the present disclosure;

FIG. 2 illustrates the example cross-section of the semiconductor device after the deposition of a conductive layer over the dielectric layer, in accordance with certain embodiments of the present disclosure;

DETAILED DESCRIPTION

Figure 3:
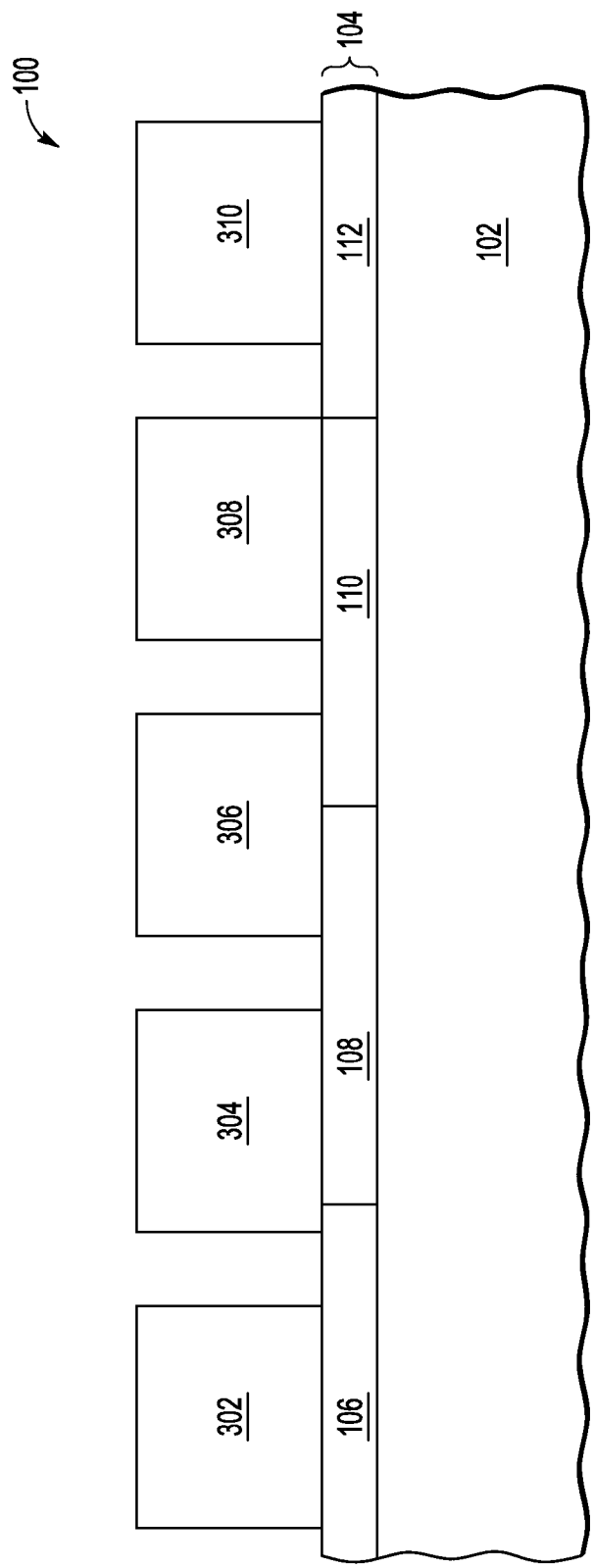
FIG. 3 illustrates the example cross-section of the semiconductor device after the patterning of the conductive layer to form gates, in accordance with certain embodiments of the present disclosure.

As the scale of semiconductor devices continues to decrease, physical limitations of current processes present new challenges in the technologies of manufacturing processes. For example, in the manufacture of certain semiconductor devices using metal gates and high-k dielectrics, a metal oxide ("MeOx") gate dielectric may be used. Such a dielectric typically has multiple grain boundaries under the metal gate as a result of some typical manufacturing techniques. The relatively large number of grain boundaries may result in an increase in surface contamination, as well as contribution to diffusion of unwanted species for formation of fixed charges and interface states between the metal gate and the substrate (e.g., silicon).

In one aspect, a method of making a semiconductor device achieves a reduced number of grain boundaries under the metal gate by adding a relatively low level of a catalyst element as part of the semiconductor device manufacturing process. The addition of a low level of catalyst at appropriate moments during the process may result in increased grain sizes (e.g., on the order of the size of the gate). The reduction in grain boundaries underneath the gate may improve performance and/or reliability of semiconductor device 100. This may be better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

FIG. 1 illustrates an example cross-section of semiconductor device 100 at a step in a manufacturing process for forming the semiconductor device, in accordance with certain aspects of the present disclosure. In some embodiments, semiconductor device 100 may include substrate 102 over which is formed dielectric layer 104. Dielectric layer 104 may be any appropriate high-k dielectric layer for use in metal gate semiconductor devices such as hafnium oxide ($HfO_2$). Dielectric layer 104 may also be generally referred to as a "metal oxide" layer, wherein the metal oxide is any appropriate high-k dielectric material for use in metal gate semiconductor devices.

Referring again to FIG. 1, in some embodiments, dielectric layer 104 may include multiple grains 106, 108, 110, 112 of the metal oxide comprising dielectric layer 104 as a result of a deposition process of dielectric layer 104 onto substrate 102. As described in more detail below with reference to FIGS. 2-5, certain steps may be undertaken during a manufacturing process in order to create grain sizes of grains 106, 108, 110, 112 that are comparable to, or on the order of, the size of the metal gate used in semiconductor device 102. For example, as described in more detail below with reference to FIG. 5, a relatively low level of a catalyst element (e.g., nickel, iron, platinum, germanium, etc.) may be added into an atomic layer deposition ("ALD") process for the metal oxide. A typical ALD for the metal oxide (e.g., $HfO_2$) may use a precursor substance (e.g., $HfCl_4$) and an oxidizing agent (e.g., heavy water, $D_2O$) on a substrate (e.g., silicon) at a prescribed temperature (e.g., 300° C.). By adding an enzyme precursor in addition to the metal oxide precursor (e.g., Bis(methycyclopentadienyl)nickel(II) in addition to $HfCl_4$), and then subjecting the resultant ALD film to a post-deposition anneal ("PDA") process, a large-grain dielectric layer 104 may be formed.

FIG. 2 illustrates the example cross-section of semiconductor device 100 after the deposition of conductive layer 202 over dielectric layer 104, in accordance with certain embodiments of the present disclosure. In some embodiments, conductive layer 202 may be a metal layer later used to pattern a plurality of gate structures for use in the further manufacturing processes of semiconductor device 100. In some embodiments, conductive layer 202 may be formed from a different metal than that used to form dielectric layer 104.

FIG. 3 illustrates the example cross-section of semiconductor device 100 after the patterning of conductive layer 202 to form gates 302, 304, 306, 308, 310, in accordance with certain embodiments of the present disclosure. In some embodiments, gates 302, 304, 306, 308, 310 may be used for a variety of purposes in the further manufacture of semiconductor device 100. As described in more detail above with reference to FIG. 1, and below with reference to FIGS. 4-5, dielectric layer 104 may be formed in order to increase the relative grain size of grains 106, 108, 110, 112 included in dielectric layer 104. One advantage of the increased grain size is to reduce the number of grain boundaries below each of gates 302, 304, 306, 308, 310. For example, gates 302, 310 have zero grain boundaries under the gate, while gates 304, 306, 308 have one (or some fraction thereof). The reduction in grain boundaries underneath the gate may improve performance and/or reliability of semiconductor device 100.

Figure 4:
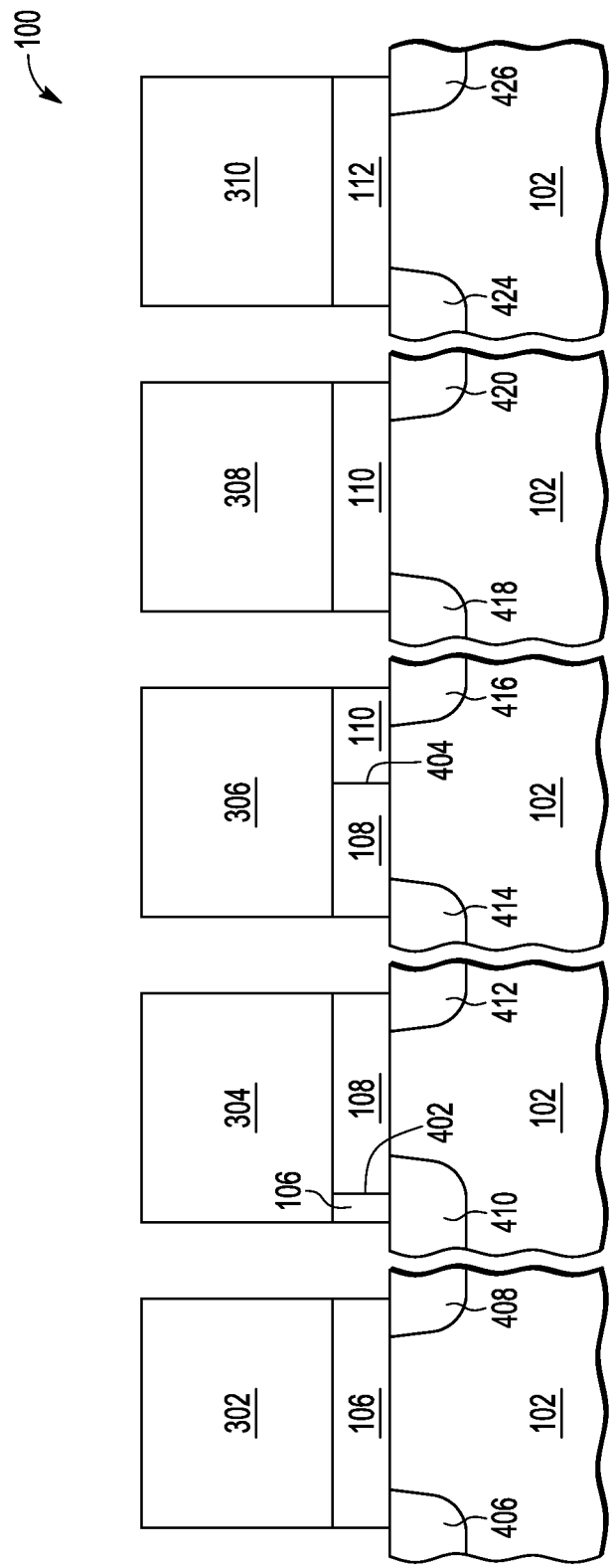
FIG. 4 illustrates the example cross-section of the semiconductor device after the further patterning of the substrate, as well as the formation of source/drain regions, in accordance with certain embodiments of the present disclosure.

FIG. 4 illustrates the example cross-section of semiconductor device 100 after the further patterning of substrate 102, as well as the formation of source/drain regions 406, 408, 410, 412, 414, 416, 418, 420, 424, 426, in accordance with certain embodiments of the present disclosure. In the simplified example semiconductor device 100, each gate 302, 304, 306, 308, 310 has two corresponding source/drain regions below the gate, formed over respective portions of substrate 102. In some embodiments, a gate may have relatively fewer grains of the material composing dielectric layer 104, and thus relatively fewer grain boundaries. In the example illustrated in FIG. 4, gate 304 has a single grain boundary 402 under gate 304, and gate 306 has a single grain boundary 404 under gate 306. The remaining gates do not have any grain boundaries under gates.

Figure 5:
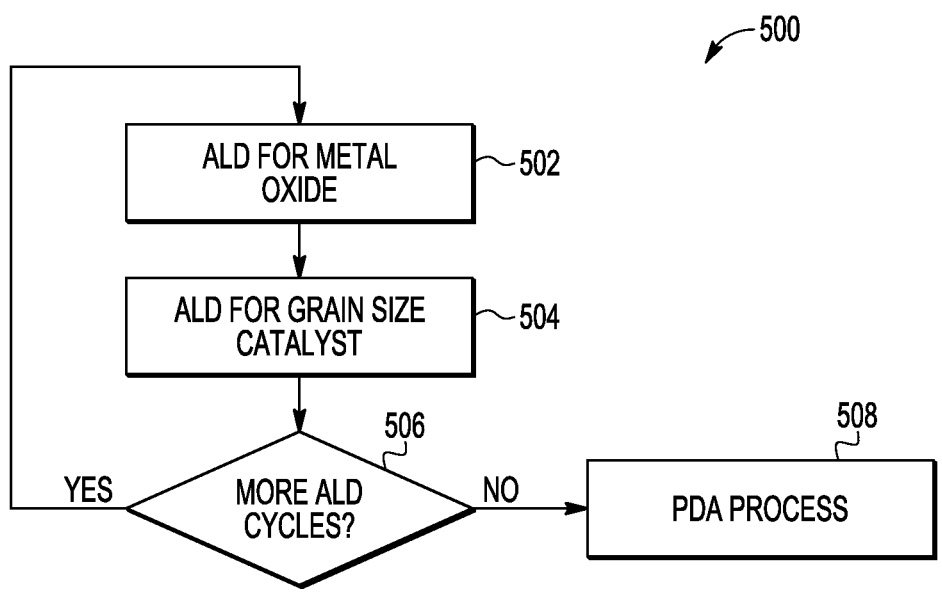
FIG. 5 illustrates an example flowchart of a method for forming the semiconductor device, including the dielectric layer with relatively large grain sizes, in accordance with certain embodiments of the present disclosure.

FIG. 5 illustrates an example flowchart of method 500 for forming semiconductor device 100, including dielectric layer 104 with relatively large grain sizes, in accordance with certain embodiments of the present disclosure. In some embodiments, method 500 may begin at 502, where an atomic layer deposition ("ALD") process for the metal oxide layer (e.g., dielectric layer 104) begins. As described in more detail above with reference to FIG. 1, a typical ALD process may include a metal oxide precursor as well as an oxidizing agent. A typical ALD process may include four steps: a pulse of the metal oxide precursor (e.g., $HfCl_4$), a "purge" of the chamber (e.g., the insertion of an inert ambient, e.g., argon), a pulse of the oxidizing agent (e.g., $D_2O$), and a second purge.

After the first metal oxide ALD cycle has completed, method 500 may then proceed to an ALD cycle incorporating a grain-size catalyst at 504. As described in more detail above with reference to FIG. 1, any appropriate catalyst may be used, such as nickel, platinum, iron, or germanium. For example, nickel may be used as the grain-size catalyst. In order to introduce the catalyst to the process of forming dielectric layer 104, a catalyst precursor may be used in an ALD process (e.g., at 504). TABLE 1 below lists precursors that may be used for the listed catalyst element.

TABLE 1

| Grain-Size Catalyst Precursor | Catalyst |
| --- | --- |
| Bis(methylcyclopentadienyl)nickel(II) | Nickel |
| Cyclopentadienyl(trimethyl)platinum(IV) | Platinum |
| Bis(N,N'-di-tert-butylacetamindinato)iron(II) | Iron |
| Digermane, Germane, or Tetramethylgermanium | Germanium |

An example ALD process for introducing a low level of a catalyst may include a two-step pulse-purge, a four-step pulse catalyst precursor-purge-pulse oxidizing agent-purge; or a four-step pulse catalyst precursor-purge-pulse-hydrogen-purge.

In some embodiments, a "low level" or a relatively low level of a catalyst may be such that the amount of a catalyst is measured in parts per million with respect to the metal oxide forming dielectric layer 104. For example, a large-grain hafnium oxide dielectric layer may include $4 \times 10^{10}$ atoms/cm$^2$ of nickel, while the number of hafnium oxide molecules would be on the order of $10^{16}$/cm$^2$.

After performing an ALD cycle for the grain-size catalyst, method 500 may determine whether more ALD cycles are necessary at 506. This determination may be made based on, among other factors, whether dielectric layer 104 has grown to an appropriate thickness. For example, an ALD cycle may grow dielectric layer 104 at a rate of approximately one-half angstroms per cycle. Thus, 30-60 cycles may be needed or desired to grow dielectric layer 104 to an appropriate thickness. If additional cycles are needed, method 500 may return to 502. If no further cycles are needed, method 500 may proceed to 508, where semiconductor device 100 may undergo a PDA process.

In some embodiments, a PDA process may be an additional step in the formation of relatively large grains in dielectric layer 104 (e.g., grains approximately of a dimension of a gate of semiconductor device 100). A PDA process may include, for example, the exposure of semiconductor device 100 including a metal oxide layer including traces of the chosen catalyst element exposed to oxygen at a high temperature (e.g., 500° C.) for a particular period of time (e.g., sixty seconds). After the particular period of time, some or all traces of the catalyst element may be removed, leaving a relatively large-grained dielectric layer 104.

Although FIG. 5 illustrates a particular order for 502-508, more, fewer, and/or different processes may be included within method 500 without departing from the scope of the present disclosure. For example, FIG. 5 illustrates 502, 504 as totally separate processes. However, in some embodiments, the precursor for the large-grain catalyst and the precursor for the metal oxide may be in separate containers, and injected as desired. In the same or alternative embodiments, the precursor for the large-grain catalyst and the precursor for the metal oxide may be kept in separate containers, but injected at the same time.

By now it should be appreciated that there has been provide systems and methods for a semiconductor device 100 using a substrate (102). The method may include depositing a metal oxide (104) over the substrate, wherein that includes combining a first metal and oxygen to form the metal oxide having grains (106-112) and further adding a catalyst during the combining, wherein the catalyst causes the grains to be bigger than would occur in the absence of the catalyst; and forming a conductive layer (202) over the metal oxide. The first metal may include, for example, hafnium. The catalyst comprises may include, for example, nickel. As a further example, the catalyst may be one of a group consisting of nickel, platinum, iron, and germanium. In some embodiments, a concentration of the hafnium in the metal oxide may exceed a concentration of the nickel in the metal oxide by at least a factor of ten thousand.

In some embodiments, the conductive layer may include a second metal different from the first metal. The first metal may have a first concentration in the metal oxide and the catalyst may have a second concentration in the metal oxide, wherein the first concentration is at least 10 thousand times greater than the second concentration.

In some embodiments, combining the first metal and the oxygen may include combining a precursor comprising the first metal with water. The water may be further characterized as being heavy water.

In some embodiments, the method may include patterning the conductive layer to form a gate having a gate length, wherein the gate length is less than an average lateral dimension of a grain. The average lateral dimension may be at least four times greater than the gate length.

In some embodiments, adding a catalyst may include adding a precursor that comprises components additional to the one of the group consisting of nickel, platinum, iron, and germanium.

In some embodiments, depositing may be further characterized as performing atomic layer deposition (502, 504)) of a plurality of layers wherein at least one layer of the plurality of layers comprises the catalyst and at least one layer of the plurality of layers is free of the catalyst.

The semiconductor device, may, in some embodiments, include a metal oxide (104) comprising a first metal, oxygen, and a catalyst, wherein the first metal has a first concentration, the catalyst has a second concentration, and first concentration is at least ten thousand times greater than the second concentration; and a conductive layer (202) over the metal oxide. In some embodiments, the first metal may include hafnium and the catalyst may include nickel. The catalyst may function to increase grain size of the metal oxide.

In some embodiments, the metal oxide may include a plurality of grains (106-112), the plurality of grains separated by a plurality of grain boundaries, the conductive layer may include a plurality of gates for transistors; a first gate (304, 306) of the plurality of gates is over a first grain boundary (402, 404) of the plurality of grain boundaries; and a second gate (106, 112) of the plurality of gates is entirely over a first grain of the plurality of grains. The grains may have an average lateral dimension, the conductive layer may include a plurality of gates (302-310); a first gate of the plurality of gates may have a gate length; and the gate length may be less than the average lateral dimension.

In some methods of the present disclosure, the method may include forming a semiconductor device (100) using a substrate (102). The method may further include using atomic layer deposition (502) to form a first layer over the substrate, wherein the first layer comprises a first metal and oxygen, and using atomic layer deposition (504) to form a second layer over the substrate, wherein the second layer comprises a first metal, oxygen, and a catalyst, wherein the catalyst comprises one of a group consisting of nickel, platinum, iron, and germanium. The first metal may include hafnium and the catalyst may include nickel.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, other catalyst precursors, gate metals, and/or metal oxides may be used other than those used as illustrative examples in the present disclosure. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. A method of forming a semiconductor device using a substrate, comprising:
   depositing a metal oxide over the substrate, the depositing comprising combining a first metal and oxygen to form the metal oxide having grains and further adding a catalyst during the combining, wherein the catalyst causes the grains to be bigger than would occur in the absence of the catalyst; and
   forming a conductive layer over the metal oxide, the conductive layer comprising a second metal different from the first metal.

2. The method of claim 1, wherein the first metal comprises hafnium.

3. The method of claim 2, wherein the catalyst comprises nickel.

4. The method of claim 3, wherein a concentration of the hafnium in the metal oxide exceeds a concentration of the nickel in the metal oxide by at least a factor of ten thousand.

5. The method of claim 1, wherein the first metal has a first concentration in the metal oxide and the catalyst has a second concentration in the metal oxide, wherein the first concentration is at least 10 thousand times greater than the second concentration.

6. The method of claim 1, wherein the combining the first metal and the oxygen comprises combining a precursor comprising the first metal with water.

7. The method of claim 6, wherein the water is further characterized as being heavy water.

8. The method of claim 1, wherein the grains have an average lateral dimension, further comprising:
   patterning the conductive layer to form a gate having a gate length, wherein the gate length is less than the average lateral dimension.

9. The method of claim 8, wherein the average lateral dimension is at least four times greater than the gate length.

10. The method of claim 1 wherein:
    the first metal comprises hafnium; and
    the catalyst comprises one of a group consisting of nickel, platinum, iron, and germanium.

11. The method of claim 10, wherein the adding a catalyst comprises adding a precursor that comprises components additional to the one of the group consisting of nickel, platinum, iron, and germanium.

12. The method of claim 1, wherein the depositing is further characterized as performing atomic layer deposition of a plurality of layers wherein at least one layer of the plurality of layers comprises the catalyst and at least one layer of the plurality of layers is free of the catalyst.

13. A method of forming a semiconductor device using a substrate, comprising:
    using atomic layer deposition to form a first layer over the substrate, wherein the first layer comprises a first metal and oxygen; and
    using atomic layer deposition to form a second layer over the substrate, wherein the second layer comprises the first metal, oxygen, and a catalyst, wherein the catalyst comprises one of a group consisting of nickel, platinum, iron, and germanium; and
    forming a conductive layer over the second layer, the conductive layer comprising a second metal different from the first metal.

14. The method of claim 13, wherein:
    the first metal comprises hafnium; and
    the catalyst comprises nickel.

* * * * *